United States Patent [19]
Guenter et al.

[11] Patent Number: 5,264,715
[45] Date of Patent: Nov. 23, 1993

[54] EMITTING WITH STRUCTURES LOCATED AT POSITIONS WHICH PREVENT CERTAIN DISADVANTAGEOUS MODES AND ENHANCE GENERATION OF LIGHT IN ADVANTAGEOUS MODES

[75] Inventors: James K. Guenter, Garland; Ralph H. Johnson, Plano, both of Tex.

[73] Assignee: Honeywell Inc., Minneapolis, Minn.

[21] Appl. No.: 909,270

[22] Filed: Jul. 6, 1992

[51] Int. Cl.[5] .......................................... H01L 33/00
[52] U.S. Cl. ..................................... 257/98; 257/96; 372/45; 372/46
[58] Field of Search ............... 372/45, 46, 50; 257/98, 257/97, 91, 96

[56] References Cited

U.S. PATENT DOCUMENTS

| | | | |
|---|---|---|---|
| 3,293,513 | 12/1966 | Biard et al. | 257/79 |
| 4,675,058 | 6/1987 | Plaster | 257/79 |
| 4,675,877 | 6/1987 | Svilans | 372/46 |
| 4,766,470 | 8/1988 | Scholl et al. | 372/45 |
| 4,949,350 | 8/1990 | Jewell et al. | 372/46 |
| 4,949,351 | 8/1990 | Imanaka | 372/46 |
| 4,999,842 | 3/1991 | Huang et al. | 372/50 |
| 5,068,868 | 11/1991 | Deppe et al. | 372/45 |
| 5,088,099 | 2/1992 | Chen et al. | 372/45 |
| 5,117,472 | 5/1992 | Blyler, Jr. et al. | 385/28 |
| 5,146,465 | 9/1992 | Khan et al. | 372/45 |

FOREIGN PATENT DOCUMENTS

| | | | |
|---|---|---|---|
| 1-264275 | 10/1989 | Japan | 257/98 |
| 2-170486 | 7/1990 | Japan | 372/45 |
| 3-225885 | 10/1991 | Japan | 372/45 |
| 4-42589 | 2/1992 | Japan | 372/45 |

OTHER PUBLICATIONS

Article by R. Stephen Speer & Bobby M. Hawkins titled "Planar—Heterostructure GaAlAs LED's Packaged for Fiber Optics", IEEE, vol. CHMT-3, No.4, Dec. 1980.

Article by Min-Chuan Lin & Sien Chi titled "The Gain and Optimal Length in the Erbium-Doped Fiber Amplifiers with 1480 nm Pumping", IEEE Photonics Technology Letters, vol. 4, No. 4, Apr. 1992.

*Primary Examiner*—William Mintel
*Assistant Examiner*—Minhloan Tran
*Attorney, Agent, or Firm*—William D. Lanyi

[57] ABSTRACT

A light emitting device is provided with mirrors placed on opposite sides of the source of light and spaced apart by a distance that is determined as a function of the wavelength of the light emitted by the light source. One particular embodiment of the present invention spaces the mirrors apart by a distance equal to $n\lambda/2 + \lambda/4$, where n is an integer value that is maintained as small as possible within practical constraints. The close proximity of the mirrors and their particular spacing which is determined as a function of the wavelength inhibits undesirable modes of light emission in directions toward the mirrors. This inhibition of light in undesirable modes perpendicular to the mirrors enhances the production of light in modes that are parallel to the mirror surfaces. The overall light output efficiency of the device is enhanced through the inhibition of these undesirable modes.

19 Claims, 8 Drawing Sheets

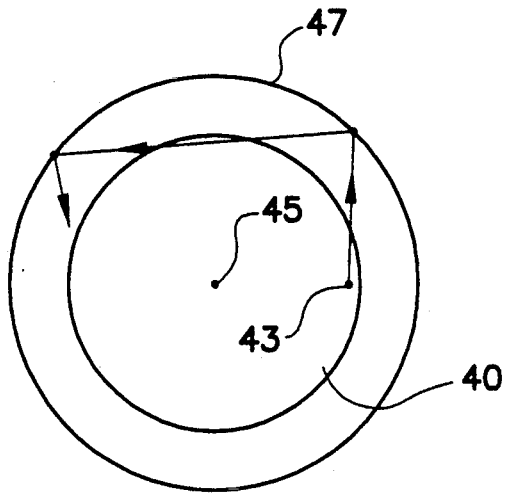
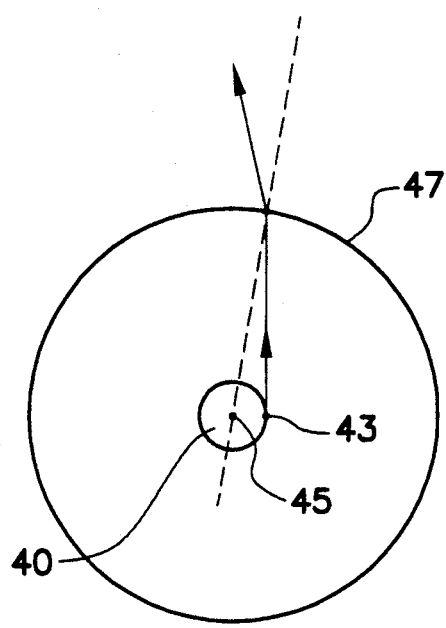
*Fig.6A*      *Fig.6B*
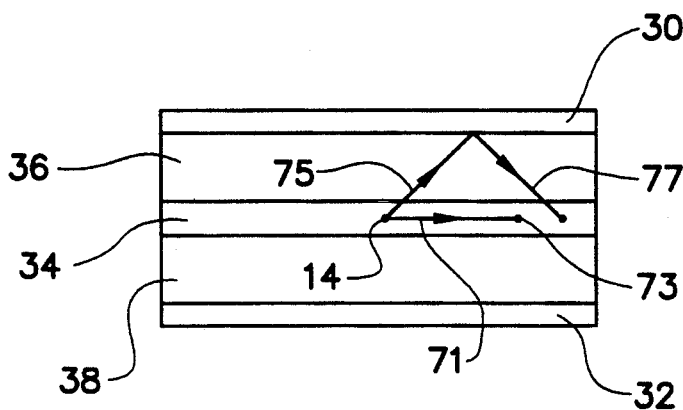
*Fig.7A*
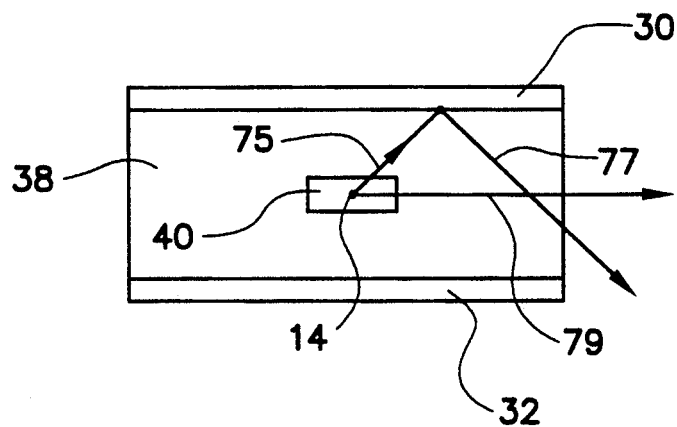
*Fig.7B*

EMITTING WITH STRUCTURES LOCATED AT POSITIONS WHICH PREVENT CERTAIN DISADVANTAGEOUS MODES AND ENHANCE GENERATION OF LIGHT IN ADVANTAGEOUS MODES

BACKGROUND OF THE INVENTION

1. Field of the Invention

The present invention is generally related to light emitting diodes and, more specifically to a light emitting diode structure which eliminates certain undesired modes so that the generation of light in desired modes is enhanced.

2. Description of the Prior Art

Many different types of light emitting diodes are known to those skilled in the art. For example, U.S. Pat. No. 3,293,517, which issued to Biard et al on Dec. 20, 1966, discloses a gallium-arsenide radiant diode which emits light in the near infrared spectrum when the junction of the diode is forward biased.

In the years since the initial development of the light emitting diode, or LED, many attempts have been made to improve its generally low overall efficiency. Because the emission of light within a light emitting diode is isotropic, a significant portion of the light emitted within the active region of the diode is emitted in disadvantageous directions toward the internal portions of the diode and is therefore ineffective in supplementing the total effective light output of the diode. In addition, a portion of the light which is emitted in the general direction toward the output surface of the diode, but not within the critical angle for reflection, passes in a direction which is reflected back into the body of the diode because of the relative indices of refraction of the diode structure and the surrounding atmosphere. It has been determined that, in a typical light emitting diode, approximately 2% of the total amount of light generated in the active region of the diode is actually available as light output from a single surface of the diode for each reflective pass. As a result of this low external efficiency of the typical light emitting diode, many efforts have been made since the initial development of the light emitting diode to improve its output efficiency.

U.S. Pat. No. 4,675,058, which issued to Plaster on Jun. 23, 1987, discloses a method of manufacturing a high bandwidth, high radiance, surface emitting LED. An LED made in accordance with this patent comprises an epitaxial layer of semiconductive material which is formed in a mesa shape.

U.S. patent application Ser. No. 07/764,651, which was filed on Sep. 24, 1991 and assigned to the Assignee of the present application, describes a high speed visible light emitting diode which emits visible light in a highly efficient manner to achieve an improved intensity of light emission compared to diodes previously known to those skilled in the art. The LED can utilize a substrate having a mesa region to provide an elevated surface. It is provided with a blocking layer on the substrate with a lower confining layer on the blocking layer. An active layer is provided on the lower confining layer with an upper confining layer above the active layer.

Other attempts to improve the efficiency of the light emitting diode output include the development of etched-well LED's that improve the coupling of radiation from the LED to an optical fiber. Additional techniques include the use of a "pigtailed" optical source having a short piece of optical fiber permanently attached to an LED package to provide a high performance optical link. Some techniques involve the use of a microlens associated with the active region of an LED to direct the emitted light in a preferred direction. These and other related concepts are discussed in an article by R. Stephen Speer and Bobby M. Hawkins titled "Planar—Heterostructure GaAlAs LED's Packaged for Fiber Optics" which was published in the IEEE Transactions on Components, Hybrids and Manufacturing Technology, Vol. CHMT-3, Number 4, December 1980.

The work described above primarily involves efforts to improve the output of light emitting diodes. However, it should be understood that these and other techniques could alternatively be applied to lasing devices such as laser diodes. Furthermore, it should also be understood that the basic concept of limiting light output to a single mode is generally known to those skilled in the art in relation to fiber amplifiers. For example, the gain and optimal length in the Erbium-doped fiber amplifiers with 1480 nm pumping in the IEEE Photonics Technology Letters, Volume 4, number 4, April 1992 by Min-Chuan Lin and Sien Chi, provides approximate analytic expressions for the gain and optimal length of the 1480 nm-pumped Erbium-doped fiber amplifier with an arbitrary dopant distribution. The numerical calculations show that the values predicted from the analytic expressions of the maximal gain and optical fiber length as functions of input signal and pumped powers are very accurate for narrow dopant distributions confined to the center of the fiber core.

This article describes single-mode fibers which, as will be discussed below, provide an optical fiber within a cladding layer in which the diameter of the optical fiber is particularly selected to inhibit emission of light in directions other than generally parallel to the central axis of the fiber core. Most of the techniques currently applied by those skilled in the art to improve the output of light emitting diodes or lasers are either related to increasing the total production of light from the diode or to more efficiently handling the output of the light emitting diode. For example, steps such as those discussed in the Plaster patent described above increase the radiance of the diode.

The majority of the techniques known to those skilled in the art for the improvement of the output efficiency of a light emitting diode attempt either to increase the overall intensity of light emitted by the diode, to improve the handling efficiency of the light emitted toward the output surface of a light emitting diode or to reflect light from a disadvantageous direction toward an advantageous direction within the structure of the diode. It would therefore be significantly beneficial to the field of light emitting devices if an LED could be developed which actually inhibits the creation of light in disadvantageous directions so that the overall emission of light in advantageous directions is correspondingly enhanced.

SUMMARY OF THE INVENTION

The present invention provides a light emitting diode which enhances the overall light output of the LED by inhibiting the emission of light in disadvantageous directions within the structure of the LED. It disposes a source of light between two structures that are spaced apart by a predefined distance that is specifically selected as a function of the wavelength of light intended to be emitted by the light source. In a preferred embodiment of the present invention, the source of light is an active region of a light emitting diode and the structures are mirrors which comprise alternative layers of semiconductive material. The two mirrors are spaced apart by a preselected distance which inhibits the emission of light in directions generally toward the mirrors. This result can be accomplished if the distance between the mirrors is of a magnitude other than the resonant condition where the distance is an integral multiple of one half of the wavelength of light emitted by the diode. Throughout the following description of the present invention, the wavelengths of light refer to those within the medium of propagation. For example, if the distance between the mirrors is equal to $n\lambda/2+\lambda/4$, the emission of light in modes generally perpendicular to the mirrors is prevented. By intentionally preventing unwanted modes in this way the emitted light of the LED is more strongly emitted in the desired modes which are more generally parallel to the reflective surfaces of the mirrors. The basic concept utilized by the present invention according to the principles of Quantum Field Theory has also been applied by those skilled in the art to create single mode optical fibers which comprise a layer of cladding around a core which is of a sufficiently small diameter to prevent modes of light transmission in directions toward the cladding layer.

BRIEF DESCRIPTION OF THE DRAWINGS

The present invention will be more fully understood from a reading of the Description of the Preferred Embodiment in conjunction with the drawings, in which:

FIGS. 6A and 6B illustrate the geometric advantage of an active layer having a reduced horizontal dimension;

FIGS. 7A and 7B illustrate additional advantages of an active layer having a reduced horizontal dimension;

DESCRIPTION OF THE PREFERRED EMBODIMENT

Figure 1:
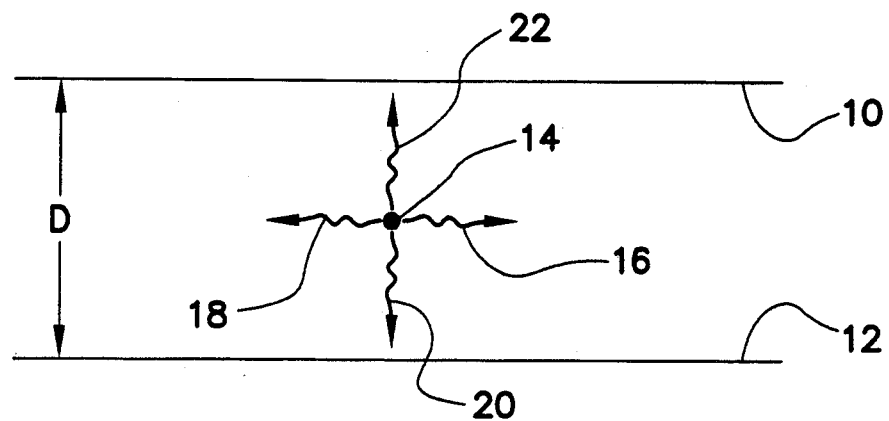
FIG. 1 illustrates the possible directions of travel of light between two mirror surfaces.

Throughout the Description of the Preferred Embodiment of the present invention, like reference numerals will be used to identify like components.

Light emitting diodes known to those skilled in the art are typically characterized as emitting light randomly to all modes isotropically. When the light is emitted within the active region of a light emitting diode, the emitted light is therefore isotropic. Because of the critical angle, which is a function of the indices of refraction at both sides of the LED's output surface and which determines whether light will be reflected or transmitted through interfaces of the light emitting diode, the light generally available for emission from the diode structure is a relatively small percentage of the total internally generated light. The present invention is directed toward improving this inefficient situation by modifying the modal density of light emitted within the diode so that the maximum modal density is generally normal to the output surface of the chip and the minimum modal density is generally parallel to the output surface of the chip. This is accomplished by reducing the modes propagating parallel to the output surface of the chip.

Since the light is generally emitted within the diode into all modes of the system randomly and isotropically, reduction of unwanted modes does not create more light, but causes the same internally generated light to be distributed into fewer but more advantageous modes which are in the desired directions. It is well known that, according to the principles of Quantum Field Theory, the probability for spontaneous emission is proportional to the optical mode density. If the distance between confining structures is carefully chosen, the possible modes can be limited to those which are more desirable. If that distance between confining structures is not amenable to creation of the wavelength of the light intended to be emitted by the active layer of the device, those emissions are prevented in the directions toward the confining structures.

The present invention comprises any structure within a light emitting device which inhibits the emission of light in a direction toward it. The distance from the region of emission, such as the active layer of a light emitting diode, and the associated structure, such as a mirror, should be less than the coherence length of the emitted photons created within the active region, where the coherence length is defined as the square of the average wavelength of light divided by the range of wavelengths emitted by the device. The recombination events that occur within the active region of the LED are intimately related to the surrounding structures if the distance from the region of emission to the structure is less than this coherence length.

The interference structures, such as mirrors, which permit the wanted modes and prevent the unwanted modes can be placed at virtually any location that is on the order of being within the coherence length of the light source. The effect of the present invention is enhanced if the mode limiting interference structures are also placed as close as possible to the source of photon emission. The structures need not be dielectric stacks of semiconductive layers, but may also comprise other types of mirrors.

One implementation of the present invention disposes the active region of a light emitting diode between structures, such as mirrors, to produce an edge emitting diode. This type of structure and alternative embodiments of the present invention could possibly be fabricated through the use of organo-metallic vapor phase epitaxy (OMVPE), molecular beam epitaxy (MBE) or metallo-organic molecular beam epitaxy (MOMBE) technology. Alternatively, other accurate epitaxial techniques could possibly be used. The mirror structures in this embodiment of the present invention can be placed above and below the active region at a distance from the active region which is close enough to have the effect of decreasing the vertical modal density in directions generally toward the mirror surfaces.

Since there still remains a possibility that some of the emitted light will be coupled into modes that are generally in the direction of, but not perpendicular to, the mirror surfaces, the coupling of the active layer emission to these modes can be further reduced by centering the active layer of the diode on a node of the few modes with vertical components. In addition, the two mirrors can be placed close enough together and close enough to the active region so that there are virtually no modes perpendicular to the mirrors for the light to couple to. To effectively avoid these modes, the optimal mirror to mirror spacing depends on the wavelength of light emitted within the active region. Certain distances between the mirrors should be avoided if the undesired modes are to be effectively inhibited. For example, the distance between the structures should not be an even multiple of half the wavelength of the light intended to be emitted by the device. In one particular implementation of this limitation, the distance between the mirror surfaces could generally be equal to $n\lambda/2 + \lambda/4$, where n is an integer that is preferably small and $\lambda$ is the wavelength of light intended to be emitted in the semiconductor. If the proper distance between the mirrors is achieved, no modes perpendicular to the mirrors will exist. This concept is illustrated schematically in FIG. 1.

FIG. 1 shows a simplified representation of a first mirror surface 10 and a second mirror surface 12 which are spaced apart by a distance D. Also shown in FIG. 1 is an exemplary location 14 at which a photon of light can hypothetically be created. In the illustration of FIG. 1, two potential horizontal directions, 16 and 18, and two potential vertical directions, 20 and 22, are illustrated emanating from the light emission location 14. If the two mirror surfaces, 10 and 12, are spaced apart by an appropriate distance, creation of light in the vertical directions, 20 and 22, will be prevented and creation of light in the horizontal direction, 16 and 18, will be enhanced. The present invention applies the principles of Quantum Field Theory by spacing the two mirror surfaces, 10 and 12, apart by a distance which is not amenable to creation of the wavelength of light that is intended to be emitted within an active layer disposed between the mirrors and, therefore, those emissions of light in a direction generally perpendicular to the mirrors are prevented.

Figure 2:
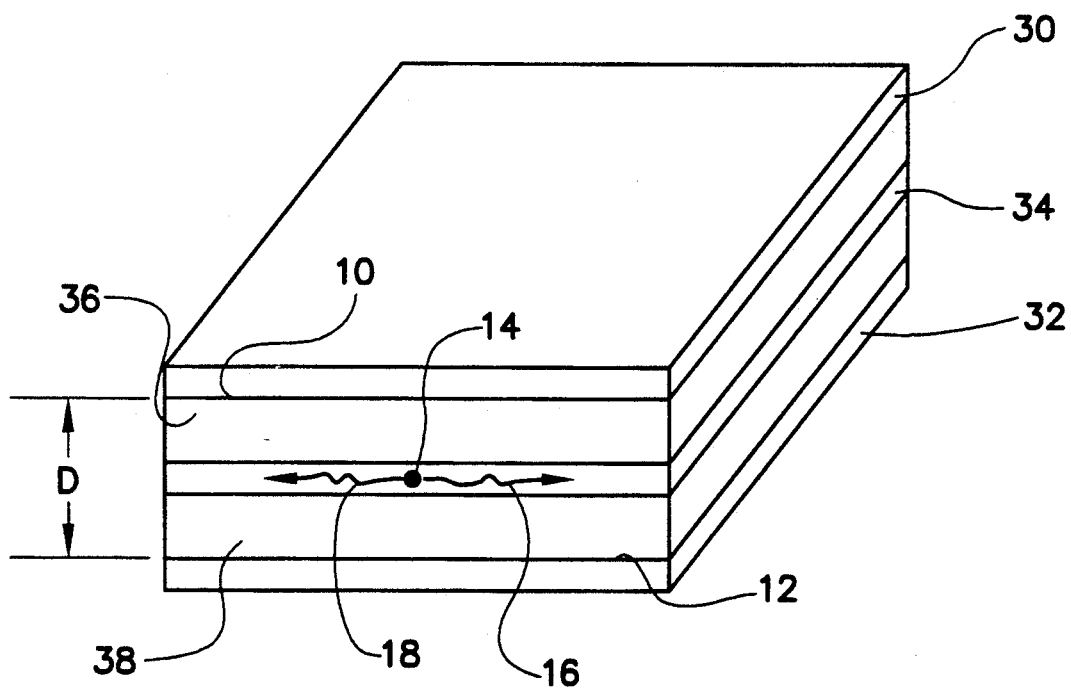
FIG. 2 illustrates a semiconductive device employing the concept of the present invention.

FIG. 2 shows a simplified illustration of one possible embodiment of the present invention which was represented schematically in FIG. 1. The first 10 and second 12 mirror surfaces shown in FIG. 1 are provided by a first mirror 30 and a second mirror 32. The emission of light at location 14 is provided within an active region 34. Between the active region 34 and the first and second mirrors generally transparent regions, 36 and 38, are provided. These transparent regions can be provided within the semiconductive structure by appropriately determining the percentage of aluminum within the regions 36 and 38. The overall structure is shaped to achieve the desired spacing D between the mirror surfaces for the purposes described above. If the spacing D is appropriately chosen as a function of the wavelength of light emitted within the active region 34, vertical modes will be prevented and horizontal modes, 16 and 18, will be enhanced.

Figure 3:
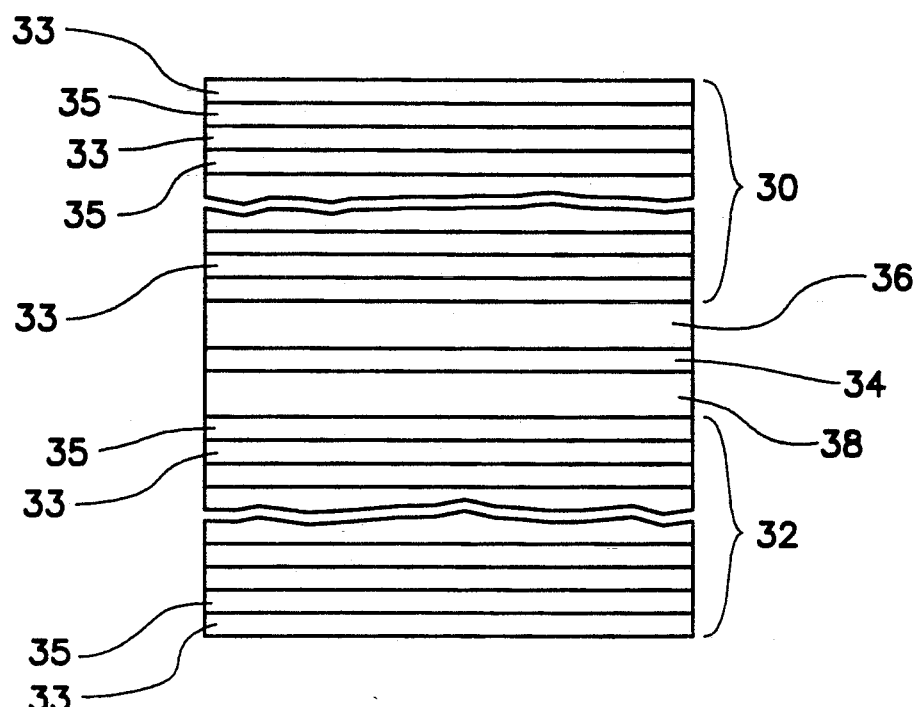
FIG. 3 shows a more detailed representation of the simplified illustration in FIG. 2.

FIG. 3 shows a more detailed illustration of the device that is shown in a simplified version in FIG. 2. By comparing FIGS. 2 and 3, it can be seen that the upper mirror 30 and the lower 32 actually comprise a plurality of layer pairs that are selected to provide the mirror for the light emitting diode. In an exemplary light emitting diode intended to emit light having a wavelength of 850 nanometers, one possible mirror structure 30 would comprise layer of $Al_xGa_{1-x}As$ where layers 33 are 66.2 nanometers thick with X=0.65 and layers 35 are 59.5 nanometers thick with a value of X=0.1. Each mirror, 30 and 32, comprise pairs of layers in which each pair comprises a layer 33 and a layer 35.

With continued reference to FIG. 3, transparent layers 36 and 38 are each 66.2 nanometers thick with a value of X=0.65. The active region 34 has a thickness which is an odd integer number multiple of 60.0 nanometers with a value of X=0.05. In other words, an exemplary embodiment of the present invention illustrated in FIG. 3 could comprise an active layer 34 that was 60 nanometers thick, 180 nanometers thick or 300 nanometers thick. If the active layer is 60.0 nanometers thick, for example, the distance between upper mirror and lower mirror 32 is 192.4 nanometers. Accounting for the index of refraction of gallium arsenide, which is approximately 3.54, the wavelength within the device would be approximately 240 nanometers. Therefore, the distance between the mirror surfaces is approximately 0.75 wavelengths of light. This is within the range described above that prevents the creation of light between the surfaces in a direction generally perpendicular to the mirrors.

With continued reference to FIG. 3, an alterative embodiment of the present invention could utilize mirrors 30 and 32 the same as those specified above, but with transparent layers, 36 and 38, which are each 22 nanometers thick with a value of X=0.65 and an active layer 34 which is 20 nanometers thick with a value of X=0.05. This results in a device having a distance between the mirror surfaces equivalent to one quarter wavelength. In other words, the thickness of the active layer 34 and the two transparent layers, 36 and 38, provide a total distance between mirror surfaces of 64 nanometers and the wavelength of light which is 850 nanometers in air is approximately 240 nanometers within the layers of the semiconductive device. Therefore, the distance between mirror surfaces is approximately equal to a quarter wavelength of the light. This distance would prevent light from being emitted in directions generally toward the mirror surfaces.

As described above, the creation of light in horizontal modes is enhanced if light can not be emitted in vertical modes. This can be seen from equation 1 below.

$$R = BnN_Z = n/\tau_n \qquad (1)$$

In equation 1, R is the rate of recombination defined as the number of electrons and holes recombining per second, B is the strength of transition, $N_A$ is the number of acceptor impurities per cubic centimeter, $\tau_n$ is the lifetime and n is the number of minority carriers injected. The rate of recombination R is distributed over all modes of light emission which, as described above, are generally isotropic in an unrestricted semiconductive device. Therefore, if the vertical modes are eliminated by the appropriate positioning of interference structures as described above, the light emitted into the horizontal modes will be increased. Equation 2 is a rearrangement of the variables of Equation 1.

$$\tau_n = 1/BN_A \qquad (2)$$

By eliminating the emission of photons in modes that are generally perpendicular to the mirrors of the present invention, the magnitude of B in equation 1 is reduced. This increases the lifetime $\tau_n$ which is discussed below in conjunction with FIG. 13. If the rate of recombination R remains constant because it is a function of the bias current imposed through the device, the horizontal mode emissions must therefore increase. As a result, the interference structures of the present invention not only prevent the emission of light in disadvantageous directions but also increase the amount of light emission in advantageous directions. The light emitting diode structure, such as that shown in FIGS. 2 and 3, can be further improved by modifying the mirrors, 30 and 32, so that they are effective over a broad range of angles. This will result in all light that is emitted being either reflected for absorption and re-emission in the active layer or allowed to exit the edges of the chip that are perpendicular to the mirror. The dielectric stack mirror which accomplishes this function can be constructed from a series of layers with gradually varying periods. Table I, shown below, represents a possible configuration of a dielectric stack mirror of this type. The thicknesses of the seven exemplary layers become progressively thicker toward one surface of the mirror than toward the other. A mirror made in accordance with the dimensions and materials shown in Table I provides an example of a reflecting structure having an enhanced reflectivity for angles with other than normal incidence. The mirror represented in Table I is designed for a wavelength of 850 nanometers, in air, to improve the reflectivity of light for nonperpendicular angles of incidence.

A mirror made in accordance with the specifications shown below in Table II shows the specifications for the mirror layers in a mirror that is optimal for perpendicular reflection. By comparing Tables I and II, it can be seen that different structures are necessary to achieve optimization for perpendicular and nonperpendicular incidents of light. The choice of mirrors in a device made in accordance with the present invention will therefore depend on the particular requirements of the overall light emitting diode design.

TABLE I

| Layer | Material | Thickness |
| --- | --- | --- |
| 1 | AlAs | 70.8 nm |
| 2 | GaAs | 59.0 nm |
| 3 | AlAs | 74.0 nm |
| 4 | GaAs | 63.0 nm |
| 5 | AlAs | 78.0 nm |
| 6 | GaAs | 67.0 nm |
| 7 | AlAs | 82.0 nm |

TABLE II

| Layer | Material | Thickness |
| --- | --- | --- |
| 1 | AlAs | 70.8 nm |
| 2 | GaAs | 59.0 nm |
| 3 | AlAs | 70.8 nm |
| 4 | GaAs | 59.0 nm |
| 5 | AlAs | 70.8 nm |
| 6 | GaAs | 59.0 nm |
| 7 | AlAs | 70.8 nm |

Figure 4:
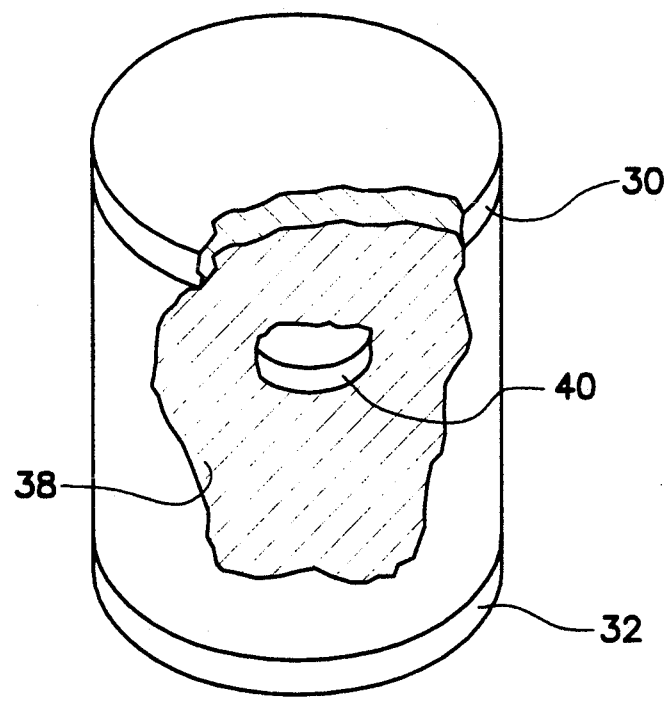
FIG. 4 shows an embodiment of the present invention comprising a disc-shaped active layer.

One embodiment of the present invention utilizes a round chip. However, although the following discussion describes a round chip, it should be clearly understood that the present invention is not limited to any particular shape, round or otherwise. FIGS. 4 and 5D schematically illustrate the construction of an LED chip in which the active region 40 is circular to improve its efficiency. FIGS. 6A and 6B are sectional views of the structure shown in FIG. 5D which will be described below. FIGS. 6A and 6B show diode devices that have different sized active layers 40. These Figures permit a side-by-side comparison of the two sizes of active regions to illustrate the advantage of a circular active layer 40 that is of a reduced diameter. For example, in FIG. 6A the active layer 40 is large enough for light to be emitted from point 43 which is a distance from the center 45 that is large enough to permit the light to extend in a direction that results in an angle of incidence with the outer surface 47 which is greater than the critical angle. As a result, the light reflects off surface 47 and is continually reflected within the body of the semiconductor as shown. This light will most likely be eventually reabsorbed within the active layer 40. As can be seen in FIG. 6A, a relatively large active region permits light to be emitted in directions which do not exit the light emitting diode and therefore do not supplement its effective light output. The structure shown in FIG. 6B, on the other hand, comprises a relatively small active layer 40 relative to the overall diameter of the light emitting diode. When light is emitted from a point 43 that is very close to the center 45 of the device, the path of the photon is always in a direction that is generally radial. As a result, the probability that the light will pass through the surface 47 is significantly enhanced. Although the light path is slightly deflected as it passes through surface 47 according to the principles of Snell's law, the light is emitted from the diode and serves to supplement the total light output of the device. By comparing FIGS. 6A and 6B, the advantages of an active layer 40 with a reduced diameter are apparent.

Figure 5A:
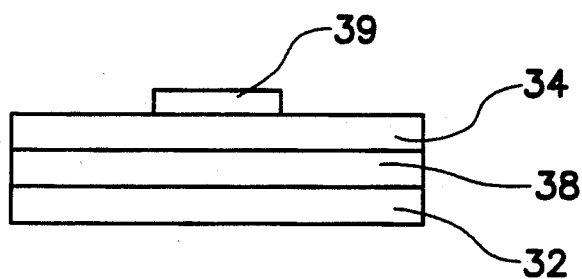
FIGS. 5A-5D show sequential forms of a light emitting diode during its manufacture.
Figure 5B:
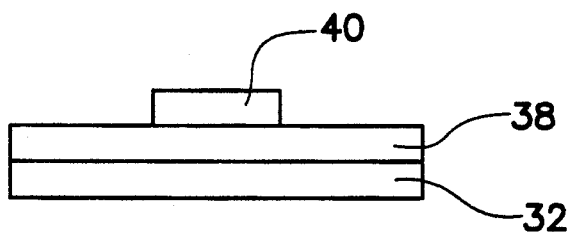
Figure 5C:
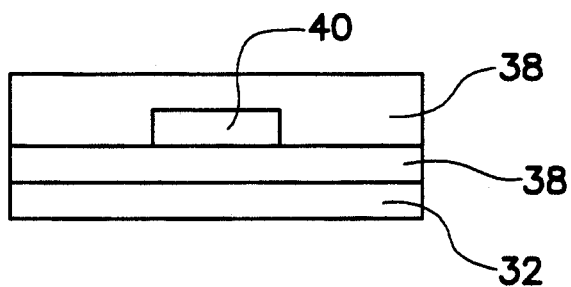
Figure 5D:
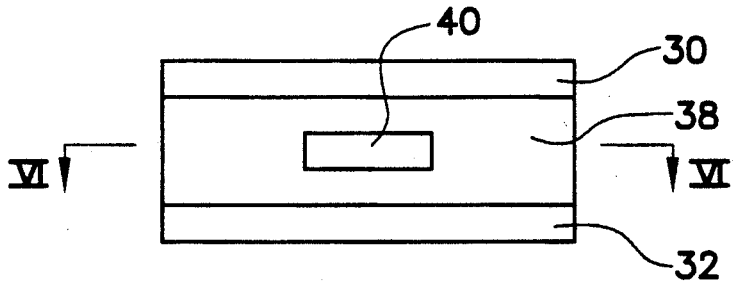

FIGS. 5A–5D show one possible series of process steps that can be implemented to provide the device illustrated in FIG. 4 which incorporates a generally disc-shaped active layer 40. With reference to FIGS. 5A–5D and FIG. 4, FIG. 5A shows a lower mirror sur 32 with a transparent layer 38 deposited thereon. An active layer 34 is shown deposited over the entire upper surface of the transparent layer 38. A circular mask 39 is located on a predetermined central area of the upper surface of active layer 34. Using etching techniques that are generally known to those skilled in the art, the portion of the active layer 34 that is not covered by the mask 39 is etched away to result in the configuration shown in FIG. 5B. The active layer 34 of FIG. 5A is reduced in size to that identified by reference numeral 40 in FIG. 5B which is generally circular as a result of the shape of mask 39. In FIG. 5C, an additional layer of transparent material 38 has been deposited over the original transparent and the active layer 40.

FIG. 5D shows the device after an upper mirror 30 is deposited over the top surface of transparent layer 38. This results in the active layer 40 being encapsulated within a transparent layer 38 with the upper and lower mirrors, 30 and 32, spaced apart by the predetermined dimension discussed above. FIGS. 6A and 6B represent alternative sizes of active layer 40 in alternative section views of FIG. 5D as discussed above. FIG. 4 illustrates a partially sectioned perspective view of the device illustrated in FIG. 5D.

FIGS. 7A and 7B illustrate two other advantages of providing an active layer that is of reduced horizontal dimension relative to the horizontal dimension of the overall semiconductive device. With reference to FIG. 7A, which is constructed according to the general principles illustrated in FIGS. 2 and 3 and described above, a photon can be emitted at point 14. Two possibly deleterious results can occur. First, the photon can be emitted in the direction represented by arrow 71 to pass along the lateral path within the active layer 34. As the photon passes along this lateral path, the likelihood of reabsorption varies directly with the distance of the path. Therefore, it can be reabsorbed as illustrated at point 73. Another potentially deleterious result is the emission of a photon along a path, such as that identified by reference numeral 75, which is not perpendicular to mirror 30 but which extends in a direction which has a component in a direction toward mirror 30 and results in a reflection off the mirror. If this reflection, which is identified by reference numeral 77, causes the photon to reenter the active layer 34, it can be reabsorbed in the active layer as shown. In both of the instances described above, the photo is reabsorbed within the active layer 34 and does not exit from the light emitting diode as usable light. Both of these disadvantageous circumstances result from the horizontal dimension of the active layer 34. FIG. 7B shows a light emitting diode with an active layer 40 which has a significantly reduced horizontal dimension. If light is emitted from point 14 in a direction indicated by reference numeral 79, it more quickly passes through the relatively short dimension of the active layer and through the transparent layer 38 to exit from the device as usable light. If, on the other hand, light is emitted from point 14 in the direction identified by reference numeral 75, it will reflect off mirror 30 and pass through the transparent portion 38 of the device to eventually exit from the light emitting diode as shown. The shortened horizontal dimension of active layer 40 permits the passage of the photon through the transparent layer in avoidance of the active layer. This minimizes the probability that the photon will be reabsorbed before it exits from the light emitting diode. Therefore, as described above in conjunction with FIGS. 6A, 6B, 7A and 7B, a light emitting diode having an active layer that is generally disc-shaped with a reduced horizontal dimension provides three significant advantages in a light emitting device made in accordance with the present invention. First, reabsorption in the active layer after reflection off a mirror is reduced as illustrated by reference numerals 75 and 77 in FIGS. 7A and 7B. Secondly, lateral absorption is reduced as illustrated by reference numerals 71 and 79 in FIGS. 7A and 7B. Thirdly, a reduced horizontal dimension places all points of possible photon emission closer to the center 45 of the device which results in aplanatic light paths wherein all photons travel along generally radial paths toward the surface 47 of the light emitting diode. Virtually no reflection occurs at surface 47 and, instead, the light passes through the surface to exit as usable light from the diode.

Figure 8A:
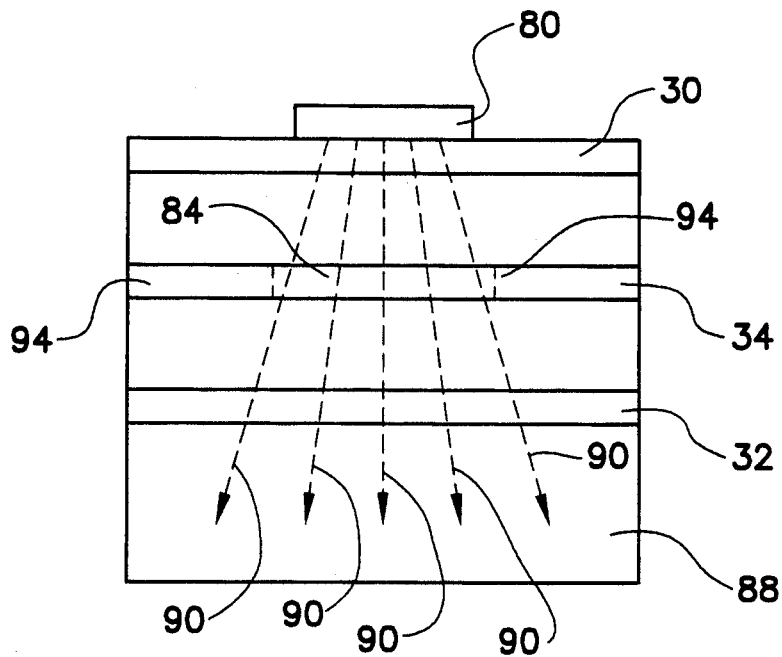
FIGS. 8A and 8B show an alternative embodiment of the present invention which utilizes self heating techniques.
Figure 8B:
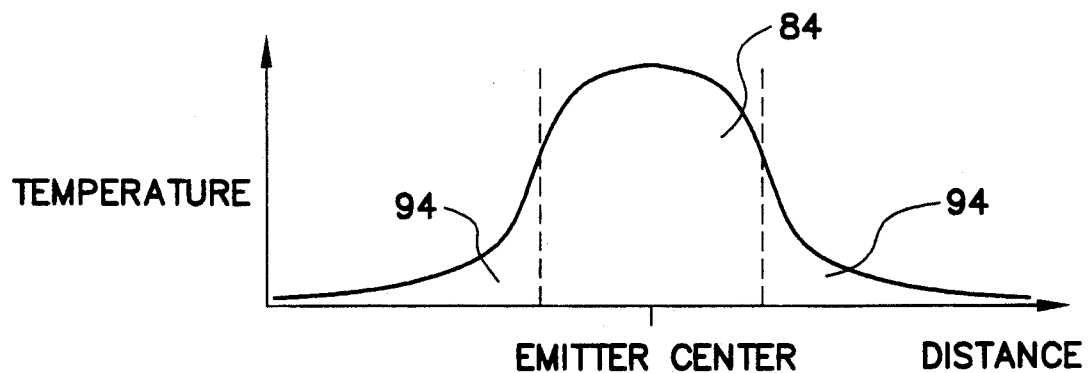

Another variation of the present invention is possible for the purpose of reducing absorption in the active layer. If the configuration represented in FIGS. 4, 5D and 7B is not feasible, and a configuration more like that shown in FIGS. 2 and 3 is utilized, a localized region of the active layer 34 can be provided through the use of self heating techniques In other words, the active region 34 could extend horizontally in all directions to the edges of the LED structure. However, only a small portion of the active structure 34 would be activated by localized heating that results from the location and size of the ohmic contact 80 used to provide current to the LED. The small activated portion can be virtually any shape, such as circular or virtually any other polygon shape. This concept is illustrated in FIG. 8A. As can be seen, the contact 80 is relatively small in comparison to the overall size of the active layer 34. As current flows from contact 80 to contact 88, its path passes through only a relatively small portion 84 of the active layer as defined by dashed line arrows 90. The other portions 94 of the active layer 34 have very little current passing through them. The result of this localization of current within the active region 34 is the localized heating of the portion between the dashed line identified by reference numeral 84. FIG. 8B illustrates the temperature profile across the active region 34. The photons emitted in the lower band gap region caused by the heating will have an increased wavelength and, therefore, reduced energy. As can be seen, the temperature is elevated in a localized region near the photon emitter center with the temperature of portion 84 being significantly higher than the other portions 94 of the active layer 34. This technique of self heating increases the temperature in portion 84 and therefore reduces the bandgap in that region. By concentrating the heating in the central region of the active layer 34, an effectively lower bandgap can be achieved for the portion of the active layer within this region. This can be accomplished by using the small contact 80 in the center of the upper portion of the chip and choosing a sheet resistance for the top layers which is sufficiently high to effectively debias the structure and concentrate the current in the central portion of the active region 34. This reduced energy for the emitted photons will significantly inhibit their reabsorption in the cooler sections of the active region which are identified by reference numeral 94 in FIGS. 8A and 8B. The concept illustrated in FIGS. 8A and 8B may possibly be difficult to accomplish in certain applications because of the significant amount of heating required within region 84.

An alternative embodiment of the present invention comprises a continuous active layer, as opposed to the small localized active layer 40 illustrated in FIGS. 4, 5D and 7B. The mirrors, 30 and 32, shown in FIGS. 2 and 3 are placed on opposite sides of the continuous active layer 34 and are spaced apart by the appropriate distance described above which is a function of the wavelength of light intended to be emitted in the active layer. The current injection exists everywhere in the active layer so that all portions of the active layer have sufficient population inversion to avoid absorption. This type of structure can apply to both lasers and LED's.

Figure 9:
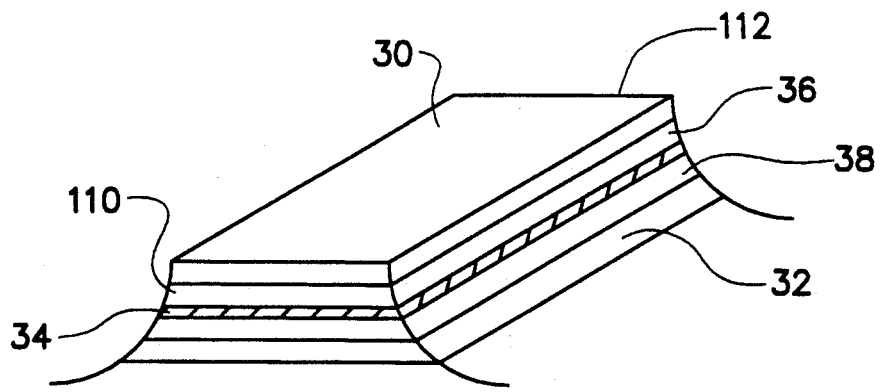
FIG. 9 illustrates a perspective view of the present invention utilized in a laser application.
Figure 10:
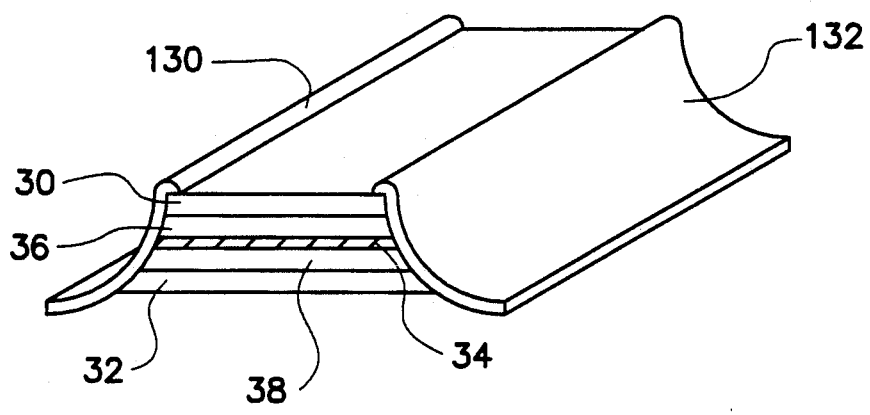
FIG. 10 shows the embodiment of FIG. 9 with the addition of side wall mirrors.

Several alternative configurations are possible within the concepts illustrated in FIG. 9. The embodiment shown in FIG. 9 can be used if the device is intended to be a laser. If it is a laser, it should be long in one direction with parallel mirrors on the ends of the cavity. This reflectivity at the ends of the cavity can be provided by the interface on ends 110 and 112. The mirrors, 30 and 32, which inhibit vertical modes in this embodiment also cause the spontaneous lifetime to increase and therefore reduce the threshold current of the laser. The increase in lifetime occurs because the rate of recombination R remains constant, as described above, while the strength of transition B decreases. Furthermore, the threshold current is the current at which light emitted in directions preferred for lasing is sufficient to achieve a round trip gain of one. Therefore, the threshold current that would otherwise be wasted for vertical mode light emission is eliminated. This provides a major advantage in the embodiments of the present invention intended for use as lasers. To reduce stimulated emission into the vertical modes, either the active layer can be placed at a node of remaining vertical modes or the vertical cavity can be manufactured extremely thin so that there are virtually no possible vertical modes. In addition, the side wall mirrors, 130 and 132, may be added to further limit modes. In lasers, exposed junctions along the sidewalls present a reliability problem in manufacturing. Often, a debiasing structure is used to avoid this problem. In the embodiment shown in FIG. 10, sidewall mirrors 130 and 132 are used. The modes are limited vertically so that the spontaneous lifetime is increased and the threshold current is reduced. If the structure is used as an LED, the mirrors on the cavity ends are removed and the output surfaces need not be parallel. The advantage in efficiency is achieved by reducing the unwanted modes by the techniques described herein.

The problem of emission into angles which are outside the critical angle can be further reduced. For example, LED's are often operated at current densities which are sufficiently high so that significant stimulated emission occurs without laser oscillation. If the LED is operated so that the current densities are high enough and the path lengths are long enough through the gain region in the desired direction, the lifetime for emission in the proper modes can be reduced substantially even without laser oscillation, by stimulated emission. This further concentrates the light emission within the desired modes.

Figure 11:
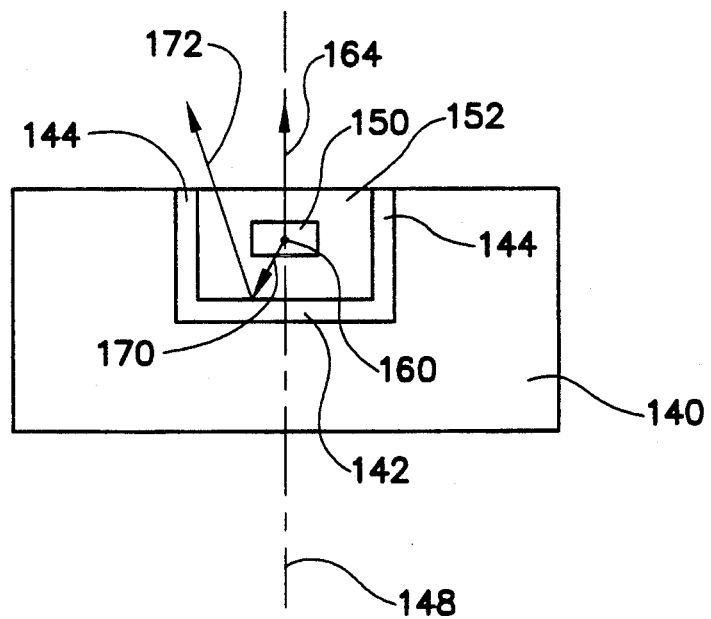
FIG. 11 illustrates an embodiment of the present invention utilizing a cup-shaped mirror surface that defines a cavity within which an active layer is disposed.

With reference to FIG. 11, an embodiment of the present invention is shown which provides a generally cup-shaped cavity whose walls are constructed of structures such as the mirrors described above. Within a substrate structure 140, a generally cylindrical hole is provided and the required layers to provide a mirror are deposited to form the cup-shaped cavity having a circular bottom mirror 142 and a cylindrical mirror portion 144 that is coaxial with axis 148. The diameter of the cylindrical walls 144 is determined as a function of the wavelength of light intended to be emitted by the disc-shaped active layer 150 which is encapsulated in a transparent layer 152 within the cup-shaped mirror structure. The diameter of cylindrical wall 144 is made so that the cavity is non-resonant for light of the wavelength emitted by the active region 150. Therefore, light will be prevented from being emitted in directions toward the wall 144 which are generally horizontal in FIG. II. The permitted modes of light emission in a structure made in accordance with this embodiment of the present invention will be in a vertical direction either upward or downward in FIG. 11 and generally parallel to axis 148. If light is emitted from location 160 in a Vertical direction, as indicated by arrow 164, it will pass through the upper surface of the transparent layer 152 where the interface between the transparent layer and air exists. If, on the other hand, light is emitted downward as indicated by arrow 170, it will be reflected by the bottom mirror 142 disposed in the bottom of the cavity. The reflected light will then pass in the direction indicated by reference numeral 172 and exit from the cavity. The advantage of the embodiment shown in FIG. 11 is that not only are the horizontal modes prevented but, in addition, the downward vertical modes are reflected upward to provide a combined emission with the light that is emitted in an upward vertical direction.

Figure 12:
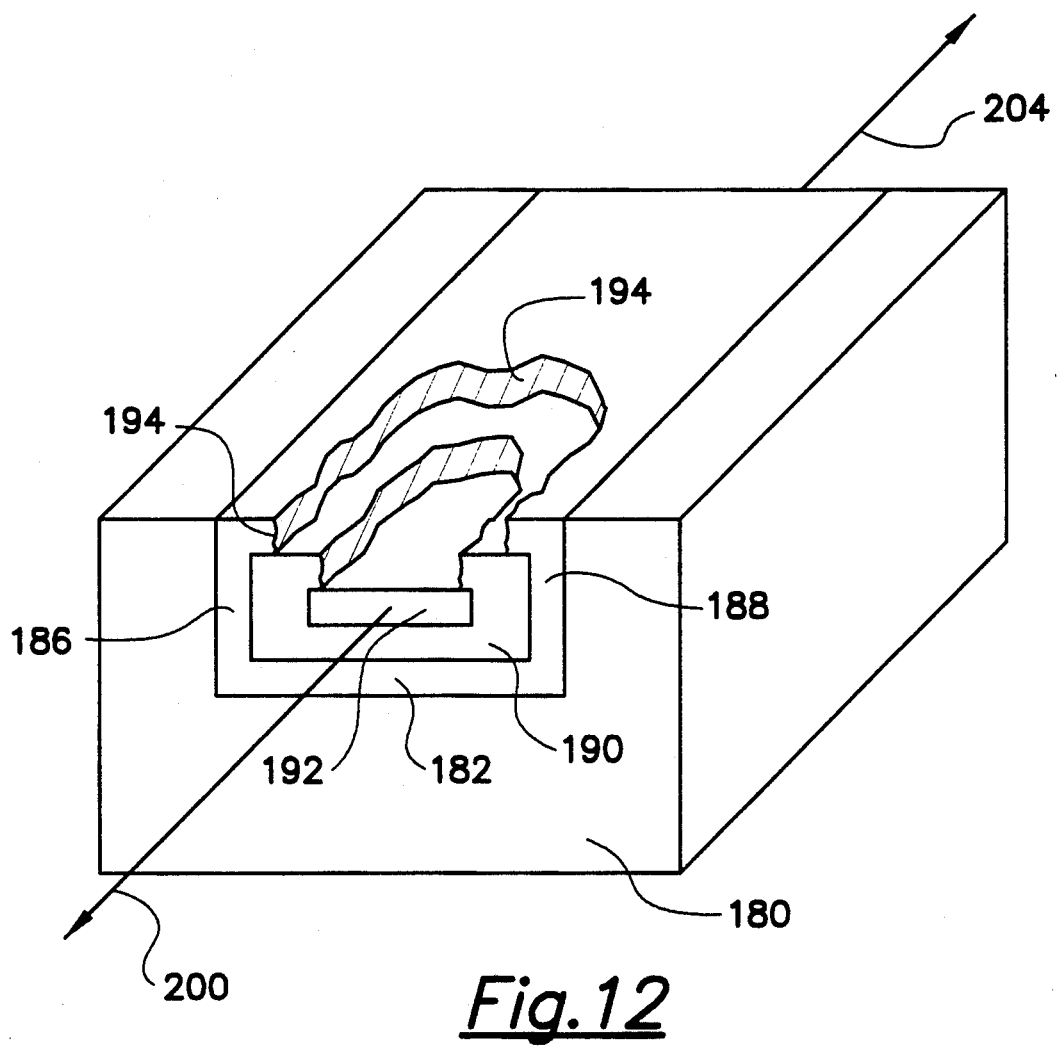
FIG. 12 illustrates an embodiment of the present invention with mirror surfaces disposed on four sides of an active layer.

FIG. 12 shows another alternative embodiment of the present invention that comprises a substrate 180 which has a trench-shaped area removed from one surface. Within the trench-shaped cavity, mirror surfaces are initially disposed at the bottom portion and the sides. The mirror at the bottom portion of the trench is identified by reference numeral 182 and the mirrors at the sides of the trench are identified by reference numerals 186 and 188 in FIG. 12. A transparent region 190 is deposited within the mirror structure and an active layer 192 is disposed within the transparent structure. A top mirror 194 is then deposited on the composite structure to encapsulate the active layer 192 and transparent portion 190. The dimension between the inner reflective surfaces of mirrors 186 and 188 is selected as a function of the wavelength of light intended to be emitted from the active layer 192 according to the procedures described in detail above. The purpose of mirrors 186 and 188 is to prevent emission of light in directions generally toward those mirror surfaces. Mirrors 182 and 194 are similarly spaced apart by a distance which will prevent emission of light in directions toward those mirrored surfaces. As illustrated in FIG. 12, light will therefore be inhibited from being emitted in directions toward the mirrors, 182, 186, 188 and 194. As a result, all light emitted within the active layer 192 must be emitted in directions generally parallel to arrows 200 and 204.

Figure 13:
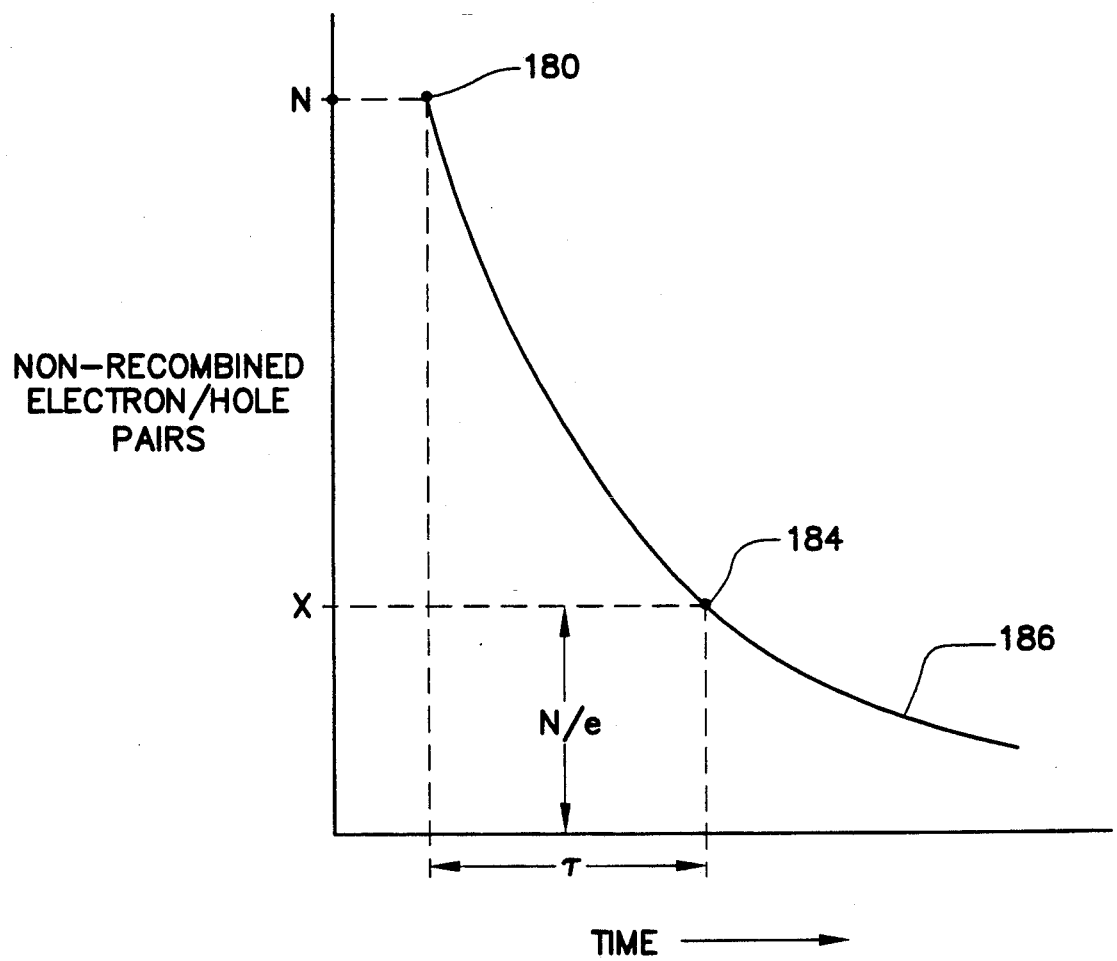
FIG. 13 illustrates the number of non recombined electron/hole pairs declining over time to define the term "lifetime".

FIG. 13 is intended to illustrate the definition of the lifetime of a semiconductive device as used above in the description of the present invention. The lifetime $\tau$ is defined as the time required for the number of nonrecombined electron/hole pairs to decline from an initial number N, as represented by point 180 in FIG. 13, to a second value X that is equal to the original value N divided by e. The magnitude of X is represented by point 184 on curve 186.

Another alternative embodiment of the present invention can be applied to vertical cavity lasers. The threshold of a vertical cavity laser depends on obtaining enough round trip gain to make up for the mirror losses. The gain can be improved by limiting spontaneous emission modes in the horizontal direction. This essentially turns the previous embodiment for lasers on its side. Although this concept is difficult to implement with currently existing technology, there may be a sufficient advancement in technology to practically implement this embodiment in the future.

Another possible embodiment of the present invention that is more practical within currently available technology is to provide an internal back and side reflector. The goal of this embodiment is to reduce modes which are vertical into the substrate while improving the probability that other modes will have sufficient opportunity, through multiple reflections within the structure, to exit through the exit surface and escape from the diode structure. The horizontal geometries can vary. In general, the angle of the mirrors on the side walls will vary along with the geometry. This type of shape may provide sufficient advantage to justify its development.

The present invention has been described in terms of several different embodiments which employ different structures and manufacturing techniques and which are intended for use in several different applications. However, each of these embodiments applies the basic concept of the present invention which relates to the placement of structures on opposite sides of a light source and the spacing of the mirrors at a distance which is a function of the light intended to be emitted and of a magnitude which inhibits light from being emitted in directions generally perpendicular to the mirrors. This phenomenon thereby enhances the emission of light in directions generally parallel with the mirrors which are more readily useable as an output from the light emitting device.

Although the present invention has been described in particular detail and numerous embodiments of different shapes have been illustrated and discussed with particular specificity, it should be understood that other embodiments of the present invention with alternative shapes are within its scope.

The embodiments of the invention in which an exclusive property or right is claimed are defined as follows:

1. A light emitting device, comprising:
a light source;
a first structure spaced a first distance from said light source; and
a second structure spaced a second distance from said light source, the sum of said first and second distances being related to the wavelength of light from said light source to prevent the generation of light from said light source in a direction generally toward said first and second structures said sum of said first and second distances is generally defined by $$D = n\lambda/+\lambda/4$$

where D is said sum of said first and second distance, $\lambda$ is the wavelength of said light and n is an integer number.

2. The device of claim 1, wherein:
n is equal to zero.
3. The device of claim 1, wherein:
said first and second structures are mirrors.
4. The device of claim 1, wherein:
said device is a semiconductive component.
5. The device of claim 4, wherein:
said semiconductive component is a light emitting diode.
6. The device of claim 4, wherein:
said semiconductive component is a laser.
7. The device of claim 4, wherein:
said light source is a generally disc-shaped active layer of said semiconductive component.
8. A light emitting diode, comprising:
means for generating light within an active layer of said diode; and
first means for preventing light from being generated in a preselected direction, said first preventing means comprising first and second structures on opposite sides of said active layer, said first and second structures being spaced apart by a distance which is unequal to an even multiple of a half wavelength of the light emitted by said generating means, said distance is generally defined by $$D = n\lambda/2 + \lambda/4$$

where D is said distance, $\lambda$ is the wavelength of said light and n is an integer number.

9. The diode of claim 8, wherein:
n is equal to zero.
10. The diode of claim 8 wherein:
said first and second structures are mirrors.
11. The diode of claim 8, further comprising:
second means for preventing light from being generated in a direction generally perpendicular to said preselected direction.
12. The diode of claim 11, wherein:
said second preventing means comprises third and fourth structures on opposite sides of said active layer, said first, second, third and fourth structures combining to define a tubular structure with said active layer disposed within said tubular structure.
13. The diode of claim 8, wherein:
said active layer is generally disc-shaped.
14. A light emitting device, comprising:
a light source; and
a plurality of structures disposed around said light source in a matrix pattern to prevent light from being emitted from said light source in directions other than a preselected direction, each one of said plurality of structures being spaced apart from another one of said plurality of structures by a distance, said distance is generally defined by $$D = n\lambda/2 + \lambda/4$$

where D is said distance, $\lambda$ is the wavelength of said light and n is an integer number.

15. The device of claim 14, wherein:
said device is a semiconductive component.
16. The device of claim 15, wherein:
said device is a light emitting diode.
17. A light emitting diode, comprising:
means for generating light; and
means for preventing light from being generated by said generating means in a preselected direction, said preventing means comprising a tubular structure disposed around said generating means, said tubular structure having a diameter which is unequal to a multiple of the half wavelength of the light generated by said generating means, said generating means being disposed within said tubular structure, said diameter being defined by $$D = n\lambda/2 + \lambda/4$$

where D is said diameter, $\lambda$ is the wavelength of light emitted by said generating means and n is an integer number.

18. The diode of claim 17, wherein:
said generating means is an active layer of said diode.
19. The diode of claim 17, wherein:
said diode is a laser device.

* * * * *

UNITED STATES PATENT AND TRADEMARK OFFICE
CERTIFICATE OF CORRECTION

PATENT NO. : 5,264,715
DATED : November 23, 1993
INVENTOR(S) : James K. Guenter and Ralph H. Johnson It is certified that error appears in the above-identified patent and that said Letters Patent is hereby corrected as shown below:

Claim 1, line 13 (column 13, line 45), cancel "$D=n\lambda/+\lambda/4$" and substitute therefor --$D=n\lambda/2+\lambda/4$--

Signed and Sealed this

Seventeenth Day of May, 1994

Attest:

BRUCE LEHMAN

*Attesting Officer*   *Commissioner of Patents and Trademarks*